United States Patent
Hall et al.

(10) Patent No.: US 8,669,158 B2
(45) Date of Patent: Mar. 11, 2014

(54) NON-VOLATILE MEMORY (NVM) AND LOGIC INTEGRATION

(71) Applicants: Mark D. Hall, Austin, TX (US); Frank K. Baker, Jr., Austin, TX (US); Mehul D. Shroff, Austin, TX (US)

(72) Inventors: Mark D. Hall, Austin, TX (US); Frank K. Baker, Jr., Austin, TX (US); Mehul D. Shroff, Austin, TX (US)

( * ) Notice: Subject to any disclaimer, the term of this patent is extended or adjusted under 35 U.S.C. 154(b) by 0 days.

(21) Appl. No.: 13/780,574

(22) Filed: Feb. 28, 2013

(65) Prior Publication Data
US 2013/0178027 A1    Jul. 11, 2013

Related U.S. Application Data

(63) Continuation-in-part of application No. 13/343,331, filed on Jan. 4, 2012.

(51) Int. Cl.
*H01L 21/336* (2006.01)
*H01L 29/66* (2006.01)

(52) U.S. Cl.
CPC .................... *H01L 29/66825* (2013.01)
USPC .................... 438/258; 257/E21.645

(58) Field of Classification Search
CPC ......... H01L 21/00; H01L 23/00; H01L 27/00; H01L 29/00; H01L 31/00; H01L 51/00
USPC ........... 438/258, 592; 257/E21.422, E21.691, 257/E21.645
See application file for complete search history.

(56) References Cited

U.S. PATENT DOCUMENTS

| | | | |
|---|---|---|---|
| 5,614,746 | A | 3/1997 | Hong et al. |
| 6,087,225 | A | 7/2000 | Bronner et al. |
| 6,194,301 | B1 | 2/2001 | Radens et al. |
| 6,235,574 | B1 | 5/2001 | Tobben et al. |
| 6,333,223 | B1 | 12/2001 | Moriwaki et al. |
| 6,388,294 | B1 | 5/2002 | Radens et al. |
| 6,509,225 | B2 | 1/2003 | Moriwaki et al. |
| 6,531,734 | B1 | 3/2003 | Wu |
| 6,635,526 | B1 | 10/2003 | Malik et al. |
| 6,707,079 | B2 | 3/2004 | Satoh et al. |
| 6,777,761 | B2 | 8/2004 | Clevenger et al. |
| 6,939,767 | B2 | 9/2005 | Hoefler et al. |

(Continued)

FOREIGN PATENT DOCUMENTS

WO    2009058486    5/2009

OTHER PUBLICATIONS

U.S. Appl. No. 13/307,719, filed Nov. 30, 2011.
U.S. Appl. No. 13/441,426, filed Apr. 6, 2012.

(Continued)

*Primary Examiner* — Julio J Maldonado
*Assistant Examiner* — Moazzam Hossain
(74) *Attorney, Agent, or Firm* — Joanna G. Chiu; James L. Clingan, Jr.

(57) ABSTRACT

A method of forming an NVM cell and a logic transistor uses a semiconductor substrate. A polysilicon select gate of the NVM cell is formed over a first thermally-grown oxygen-containing layer in an NVM region and a polysilicon dummy gate is formed over a second thermally-grown oxygen-containing layer in a logic region. Source/drains, a sidewall spacer, and silicided regions of the logic transistor are formed after the first and second thermally-grown oxygen-containing layers are formed. The second thermally-grown oxygen-containing layer and the dummy gate are replaced by a metal gate and a high-k dielectric. The logic transistor is protected while the NVM cell is then formed including forming a charge storage layer.

19 Claims, 6 Drawing Sheets

(56) References Cited

U.S. PATENT DOCUMENTS

| | | | |
|---|---|---|---|
| 7,154,779 B2 | 12/2006 | Mokhlesi et al. | |
| 7,202,524 B2 | 4/2007 | Kim et al. | |
| 7,208,793 B2 | 4/2007 | Bhattacharyya | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,795,091 B2 | 9/2010 | Winstead et al. | |
| 7,816,727 B2 | 10/2010 | Lai et al. | |
| 7,906,396 B1 | 3/2011 | Chiang et al. | |
| 7,989,871 B2 | 8/2011 | Yasuda | |
| 8,063,434 B1 | 11/2011 | Polishchuk et al. | |
| 8,138,037 B2 | 3/2012 | Chudzik et al. | |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Shroff et al. | |
| 2002/0061616 A1 | 5/2002 | Kim et al. | |
| 2004/0075133 A1 | 4/2004 | Nakagawa et al. | |
| 2006/0046449 A1 | 3/2006 | Liaw | |
| 2007/0077705 A1 | 4/2007 | Prinz et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1* | 11/2007 | Dong et al. | 438/257 |
| 2008/0050875 A1 | 2/2008 | Moon et al. | |
| 2008/0121983 A1 | 5/2008 | Seong et al. | |
| 2008/0145985 A1* | 6/2008 | Chi | 438/199 |
| 2008/0185635 A1 | 8/2008 | Yanagi et al. | |
| 2008/0237700 A1 | 10/2008 | Kim et al. | |
| 2008/0290385 A1 | 11/2008 | Urushido | |
| 2008/0308876 A1 | 12/2008 | Lee et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0273013 A1* | 11/2009 | Winstead et al. | 257/315 |
| 2009/0278187 A1 | 11/2009 | Toba | |
| 2011/0031548 A1 | 2/2011 | White et al. | |
| 2011/0204450 A1 | 8/2011 | Moriya | |
| 2012/0104483 A1 | 5/2012 | Shroff et al. | |
| 2012/0248523 A1 | 10/2012 | Shroff et al. | |
| 2012/0252171 A1 | 10/2012 | Shroff et al. | |
| 2013/0026553 A1* | 1/2013 | Horch | 257/316 |
| 2013/0037886 A1 | 2/2013 | Tsai et al. | |
| 2013/0065366 A1 | 3/2013 | Thomas et al. | |
| 2013/0171785 A1 | 7/2013 | Shroff et al. | |
| 2013/0171786 A1 | 7/2013 | Shroff et al. | |
| 2013/0178027 A1 | 7/2013 | Hall et al. | |
| 2013/0178054 A1 | 7/2013 | Shroff et al. | |
| 2013/0264633 A1 | 10/2013 | Hall et al. | |
| 2013/0264634 A1 | 10/2013 | Hall et al. | |
| 2013/0267074 A1 | 10/2013 | Hall et al. | |

OTHER PUBLICATIONS

U.S. Appl. No. 13/491,771, filed Jun. 8, 2012.

U.S. Appl. No. 13/491,760, filed Jun. 8, 2012.

Lee et al.; Theoretical and Experimental Investigation of Si Nanocrystal Memory Device With HfO2 High-k Tunneling Dielectric; IEEE Transactions on Electron Devices; Oct. 2003; pp. 2067-2072; vol. 50, No. 10, IEEE.

Chen, J.H., et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.

Krishnan, S., et al., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

U.S. Appl. No. 13/781,727, Shroff, M., et al., "Methods of Making Logic Transistors and non-Volatile Memory Cells", Office Action—Restriction, Jun. 21, 2013.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao: P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.

U.S. Appl. No. 13/491,771, Hall et al, "Integrating Formation of a Replacement Ggate Transistor and a Non-Volatile Memory Cell Using a High-K Dielectric", Office Action—Rejection, Sep. 9, 2013.

U.S. Appl. 13/442,142, Hall, M.D., et al., "Logic Transistor and Non-Volatile Memory Cell Integration", Office Action—Ex Parte Quayle, Apr. 4, 2013.

U.S. Appl. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M.., et al., "Non-Volatile Memory and Logic Circuit Process Integration", Office Action—Rejection, Aug. 15, 2012.

U.S. Appl. No. 13/077,491, Shroff, M., et al., "Non-Volatile Memory and Logic Circuit Process Integration", Office Action—Rejection, Feb. 6, 2013.

(56) References Cited

OTHER PUBLICATIONS

U.S. Appl. No. 13/077,491, Shroff, M., et al., "Non-Volatile Memory and Logic Circuit Process Integration", Office Action—Allowance, Jun. 18, 2013.
U.S. Appl. No. 13/077,501, Shroff, M., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. 13/343,331, Shroff, M., et al., "Non-Volatile Memory (NVM) and Logic Integration", Office Action—Rejection, Mar. 13, 2013.
U.S. Appl. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. 13/780,574, Hall, M.D., et al., Non-Volatile Memory (NVM) and Logic Integration, Office Action—Allowance, Sep. 6, 2013.
U.S. Appl. 13/491,760, Shroff, M., et al., "Integrating Formation of a Replacement Gate Transistor and a Non-Volatile Memory Cell Using an Interlayer Dielectric", Office Action—Allowance, Jul. 1, 2013.
U.S. Appl. No. 13/780,591, Hall, M.D., et al., "Non-Volatile Memory (NVM) and Logic Integration", filed Feb. 28, 2013.
U.S. Appl. No. 13/661,157, Shroff, M.D., et al., "Method of Making a Logic Transistor and a Non-Volatile Memory (NVM) Cell", filed Oct. 26, 2012.
U.S. Appl. No. 13/780,591, Hall, M.D., et al., "Non-Volatile Memory (NVM) and Logic Integration", Office Action—Allowance Nov. 22, 2013.
U.S. Appl. 13/343,331, Shroff, M., et al., "Non-Volatile Memory (NVM) and Logic Integration", Office Action—Allowance, Nov. 8, 2013.
Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
Office Action mailed Jan. 16, 2014 in U.S. Appl. No. 13/491,771.

\* cited by examiner

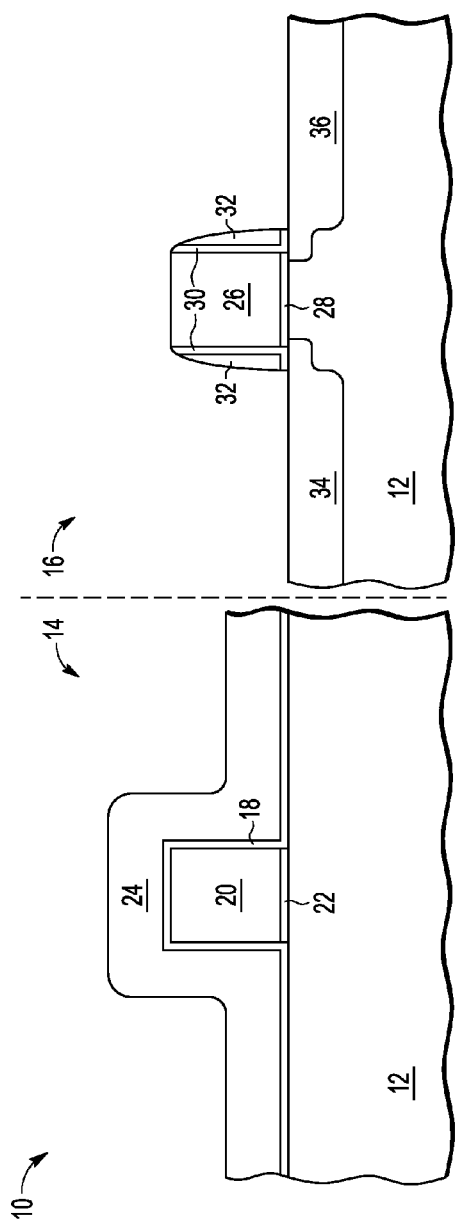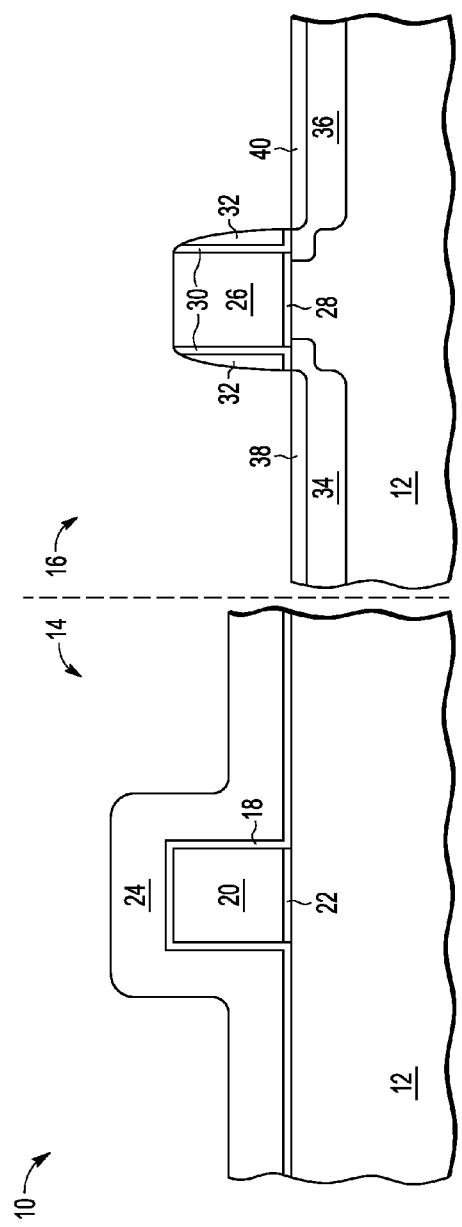

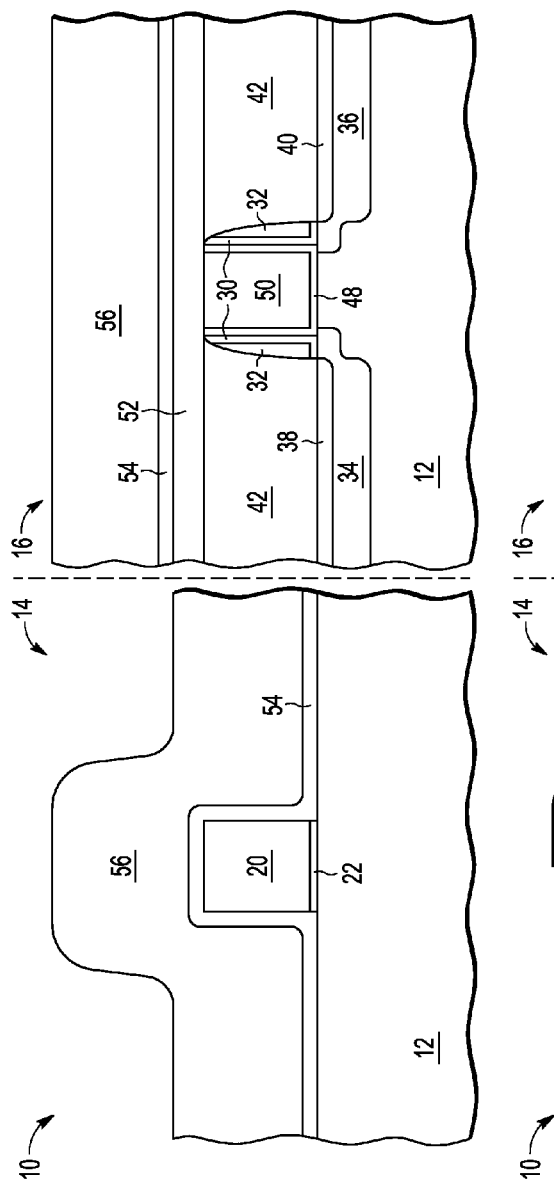

NON-VOLATILE MEMORY (NVM) AND LOGIC INTEGRATION

CROSS-REFERENCE TO RELATED APPLICATION(S)

This application is continuation-in-part of U.S. patent application Ser. No. 13/343,331, filed on Apr. 6, 2012, entitled "Non-Volatile Memory (NVM) and Logic Integration," naming Mehul D. Shroff and Mark D. Hall as inventors, and assigned to the current assignee hereof, and which is hereby incorporated by reference. This application is related to U.S. patent application Ser. No. 13/780,591, filed on event date, entitled "Non-Volatile Memory (NVM) and Logic Integration," naming Mark D. Hall, Mehul D. Shroff, and Frank K. Baker as inventors, and assigned to the current assignee hereof.

BACKGROUND

1. Field

The invention relates to non-volatile memories (NVMs), and more particularly, to NVMs integrated with logic devices.

2. Related Art

Non-volatile memories (NVMs) are often on an integrated circuit which also performs other functions. In such cases it is undesirable to sacrifice logic performance in favor of performance of the NVM. Also it is important to avoid or minimize additional cost in achieving high performance for both the logic and the NVM.

Accordingly there is a need to provide further improvement in achieving high performance while also addressing cost increase issues in integrated circuits that have both NVM and logic.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a cross section of a semiconductor device at a stage in processing according to an embodiment;

FIG. 2 is a cross section of the semiconductor device of FIG. 1 at a subsequent stage in processing;

FIG. 7 is a cross section of the semiconductor device of FIG. 6 at a subsequent stage in processing;

FIG. 8 is a cross section of the semiconductor device of FIG. 7 at a subsequent stage in processing;

DETAILED DESCRIPTION

Figure 3:
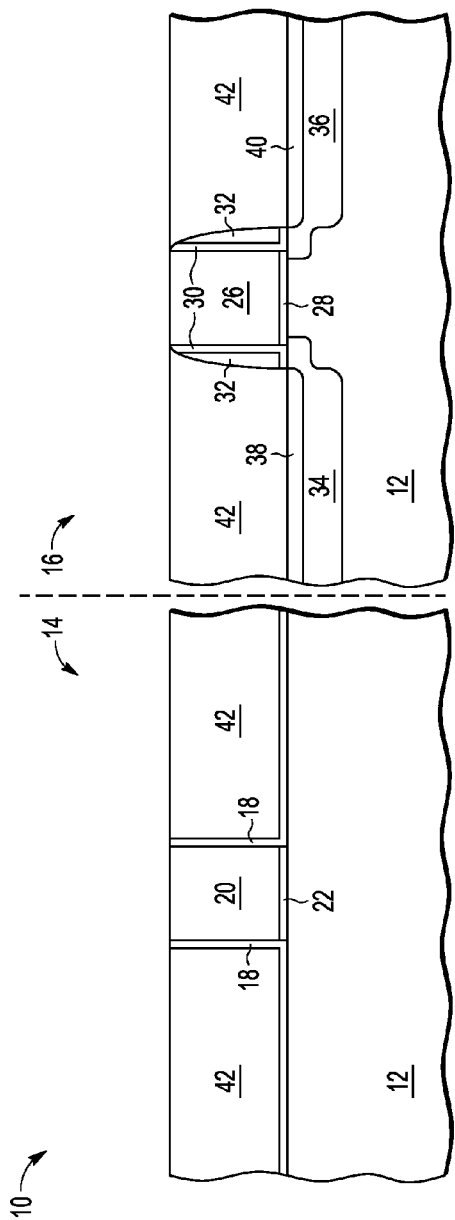
FIG. 3 is a cross section of the semiconductor device of FIG. 2 at a subsequent stage in processing.

A non-volatile memory (NVM) cell is made contemporaneously with logic transistors. This can be done, for example, with high-k gate dielectrics, metal gates, and metal nanocrystals. In one embodiment, a select gate of the NVM cell is formed using deposition and etching of polysilicon while a replacement gate process is used to form the gate of the logic transistor. The source/drain regions for the logic transistor and the silicide for the logic transistor source/drain regions are formed prior to replacement of the dummy gates in the logic region while the NVM areas remain protected by a protection layer. After replacement of the dummy gate with the actual logic gate in the logic region, the dielectric layer surrounding the select gate is removed from the NVM areas (while being maintained around the logic gate in the logic areas), after which, the charge storage layer and control gate of the NVM cell are formed. Furthermore, the source/drain regions and silicide for the NVM cell can be completed while the logic areas remain protected. This is better understood by reference to the drawings and the following written description.

Shown in FIG. 1 is a semiconductor device 10 having a substrate 12. Semiconductor device 10 is divided into an NVM region 14 and a logic region 16. NVM region 14 is for forming an NVM cell which, in this described example, is an N-channel NVM cell. Logic region 16 is for forming a logic transistor of the same doping type as the NVM cell and may be referenced as an N-channel region because the NVM cell being formed is N-channel. Note that alternatively, logic region 16 may be used for forming a P-channel transistor or forming both N-channel and P-channel transistors. Semiconductor device 10 includes a gate dielectric 22 over substrate 12 in NVM region 14 and a gate 20 over gate dielectric 22. Semiconductor device 10 includes a dummy gate dielectric 28 over substrate 12 in logic region 16, and a dummy gate 26 over dummy gate dielectric 28. Gate dielectrics 22 and 28 and gates 20 and 26 may be formed by first thermally growing an oxygen-containing layer over substrate 12 in regions 14 and 16 and then blanket depositing a polysilicon layer over the thermally grown oxygen-containing layer in regions 14 and 16. The thermally grown oxygen-containing layer and polysilicon layer may then be patterned to form gate dielectric 22 and dummy gate dielectric 28 and gate 20 and dummy gate 26. That is, the thermally grown oxygen-containing layer is used to form both gate dielectric 22 and dummy gate dielectric 28, and the polysilicon layer is used to form both gate 20 and dummy gate 26. The oxygen-containing layer may include, for example, silicon oxide or oxynitride. After formation of gate dielectrics 22 and 28 and gates 20 and 26, photoresist may be used to protect NVM region 14 while shallow implants are formed into substrate 12 in logic region 16 to form source/drain extension regions extending laterally from the sidewalls of dummy gate 26. After formation of the extension regions, a liner layer 18 is formed over substrate 12 and gates 20 and 26, and a protection layer 24 is formed over liner layer 18 in both NVM region 14 and logic region 16. Again, NVM region 14 may be protected by photoresist while an anisotropic etch is performed in logic region 16 to form a spacer liner 30 and sidewall spacer 32 surrounding dummy gate 26. Note that liner 30 is formed from liner layer 18 and spacer 32 from protection layer 24. In one embodiment, liner layer 18 is an oxide layer while protection layer 24 is a nitride layer. In one embodiment, protection layer 24 has a thickness of at least 500 Angstroms. After formation of spacer 32, while NVM region 14 may remain protected by photoresist, deep implants may be performed to form source/drain regions 34 and 36 in substrate 12, adjacent to the sidewalls of dummy gate 26. Note that source/drain regions 34 and 36 include the extension regions previously formed which extend slightly under dummy gate 26. The photoresist protecting NVM region 14 may then be removed.

Shown in FIG. 2 is semiconductor device 10 after forming silicide regions 38 and 40. Substrate 12, in logic region 16, is silicided to form silicide regions 38 and 40. During the silicidation in logic region 16, protection layer 24 protects NVM region 14 such that no silicide regions are formed in NVM region 14.

Shown in FIG. 3 is semiconductor device 10 after depositing an interlevel dielectric (ILD) layer 42 and performing a chemical mechanical polish (CMP) to expose top surfaces of gate 20 and dummy gate 26. Protection layer 24 in NVM region 14 may be removed prior to depositing ILD layer 42. As illustrated in FIG. 3, a top surface of ILD 42 in NVM region 14 is substantially aligned with a top surface of gate 20, and ILD layer 42 has an opening in which the select gate is present. Also, a top surface of ILD layer 42 in logic region 16 is substantially aligned with a top surface of dummy gate 26, and ILD layer 42 has an opening in which the dummy gate is present.

In an alternate embodiment, a different method may be used to reach the stage in processing illustrated in FIG. 3. In this alternate embodiment, and referring back to FIG. 1, after thermally growing an oxide-containing layer and blanket depositing the polysilicon layer over substrate 12 in both NVM region 14 and logic region 16, a photoresist layer may be formed over the polysilicon layer in NVM region 14 so as to protect NVM region 14 while the polysilicon layer and thermally grown oxygen-containing layer in logic region 16 are patterned to form dummy gate dielectric 28 and dummy gate 26. The photoresist layer may then be removed from NVM region 14, and subsequently, liner layer 18 and protection layer 24 may be formed over the yet-unpatterned polysilicon layer in NVM region 14 and over dummy gate 26 in logic region 16. An anisotropic etch may then be performed to form spacers 32 from protection layer 24 and liner 30 from liner layer 18. At this point, note that liner layer 18 and any remaining portions of protection layer 24 would still be located on the polysilicon layer in NVM region 14. Alternatively, during spacer formation in logic region 16, liner layer 18 and protection layer 24 may be removed from NVM region 14. NVM region 14 can again be protected by a photoresist layer so that formation of source/drain regions 34 and 36 may be completed. The photoresist layer can be removed from NVM region 14, and a photoresist layer may then be formed to protect logic region 16. At this point, the polysilicon layer and thermally grown oxygen-containing layer may be patterned in NVM region 14 to form gate dielectric 22 and gate 20. After the patterning in NVM region 14 and removal of the photoresist layer from logic region 16, ILD layer 42 may be formed and polished to expose top surfaces of gate 20 and dummy gate 26, as shown in FIG. 3.

Figure 4:
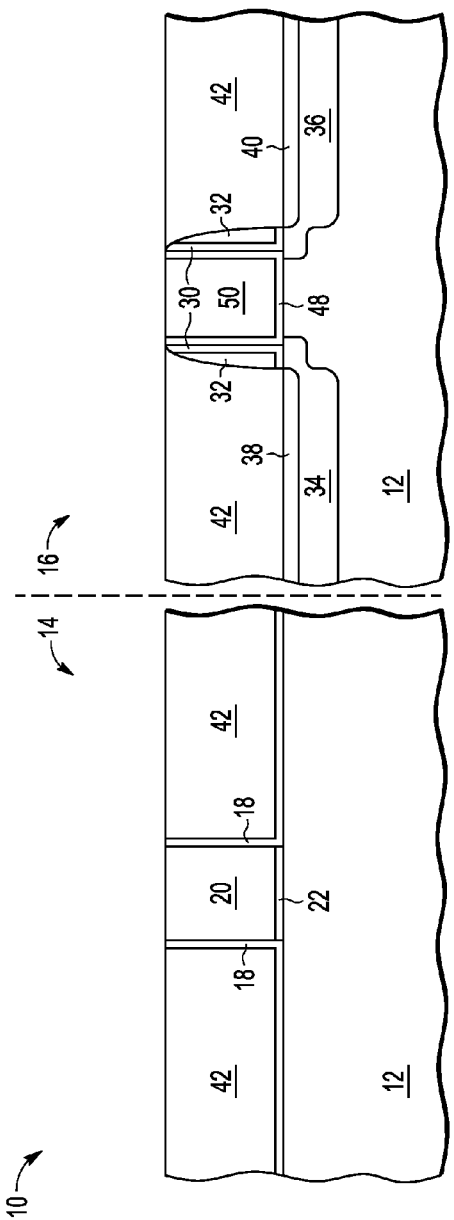
FIG. 4 is a cross section of the semiconductor device of FIG. 3 at a subsequent stage in processing.

Shown in FIG. 4 is semiconductor device 10 after replacement of dummy gate 26 and dummy gate dielectric 28. Dummy gate 26 and dummy gate dielectric 28 are first removed, thus creating an opening in ILD 42 which exposes substrate 12. A high-k gate dielectric layer is then formed over ILD 42 and within the opening in ILD 42 and a gate stack layer is then formed over the high-k gate dielectric layer, also within the opening in ILD 42. A CMP is then performed to remove regions of the high-k gate dielectric layer and gate stack layer from over ILD 42 such that these layers remain only within the opening of ILD 42. Therefore, within each opening in ILD 42 in logic region 16, a high-k gate dielectric 48 is formed along substrate 12 and sidewalls of ILD 42, and a gate stack 50 is formed on high-k gate dielectric 48, between sidewalls of ILD 42. Therefore, note that a top surface of ILD 42 is substantially aligned with a top surface of gate stack 50. Also, note that, in the illustrated embodiment, only dummy gates and dummy gate dielectrics, such as dummy gate 26 and dummy gate dielectric 28, within logic region 16 are replaced with actual gate stacks and gate dielectrics, while the previously formed gate dielectrics and gates, such as gate dielectric 22 and gate 20, in NVM region 14 are not replaced and thus remain as previously formed (i.e. as a thermally grown oxygen-containing gate dielectric and a polysilicon gate, respectively).

High-k gate dielectric 48 may be oxides of a metal, such as, for example, hafnium oxide, lanthanum oxide, aluminum oxide, and tantalum oxide. Also, high-k gate dielectric 48 may additionally include a thin buffer oxide layer. In one embodiment, a high-k gate dielectric has a dielectric constant of greater than or equal to 7. The gate stack layer, and therefore gate stack 50, may include a metal that is chosen for its effectiveness in setting the work function of the transistor. For example, in the case of an N-channel transistor or NVM cell, the metal may be tantalum carbide or lanthanum. In the case of a P-channel transistor, the metal may be molybdenum or titanium nitride. The gate stack layer, and therefore gate stack 50, may also include an additional one or more metals on the work-function-setting metal, where the top-most metal of the gate stack may be referred to as the top metal. Examples of the additional metal include aluminum, tungsten, tungsten nitride, and tantalum nitride. Many other metals may also be used. The gate stack layer may also include polysilicon that is silicided with metals such as, for example, nickel or cobalt. Although referenced as a gate stack, it may be feasible for gate stack 50 to be just one type of metal rather than a stack of different metal types.

Gate stack 50 may also be referred to as a replacement gate or an actual gate, and gate dielectric 48 may be referred to as a replacement gate dielectric or an actual gate dielectric, in which gate stack 50 and gate dielectric 48 are formed using a replacement gate process and remain as part of semiconductor device 10 upon completion. Gate 20, which is a polysilicon gate, corresponds to the select gate of an NVM cell being formed in NVM region 14 and may therefore also be referred to as select gate 20. Gate stack 50 corresponds to the gate of a logic transistor being formed in logic region 16 and may therefore also be referred to as logic gate 50.

Note that thermally grown oxygen-containing gate dielectric 22 is formed prior to the formation of high-k gate dielectric 48. In this manner, the higher heat requirements for forming a thermally grown oxygen-containing layer for gate dielectric 22 do not damage the high-k gate dielectrics of logic region 16 (such as high-k gate dielectric 48). Note that a thermally grown oxygen-containing layer allows for a higher quality gate dielectric as compared to a deposited oxygen-containing layer. However, the temperatures required for thermally growing such an oxygen-containing layer may damage existing high-k dielectric layers. For example, in one embodiment, the thermal growth of an oxygen-containing layer is performed at a temperature of greater than 800 degrees Celsius, greater than 900 degrees Celsius, or even greater than 1000 degrees Celsius, whereas a high-k dielectric layer may be damaged upon being exposed to a temperature of greater than 600 degrees Celsius or 700 degrees Celsius. While it may be possible that a high-k dielectric layer may be able to see a maximum temperature of 900 degrees Celsius without damage, some embodiments require a temperature of greater than 900 degrees Celsius for thermally growing an oxygen-containing layer. Therefore, by utilizing a gate replacement process to form the logic gates in logic region 16 after formation of the thermally grown oxygen-containing gate dielectrics of the NVM cells in NVM region 14, high-k gate dielectrics can be used for the logic devices in logic region 16 without exposing them to the damaging high temperatures required during the formation of the gate dielectrics in NVM region 14.

Figure 5:
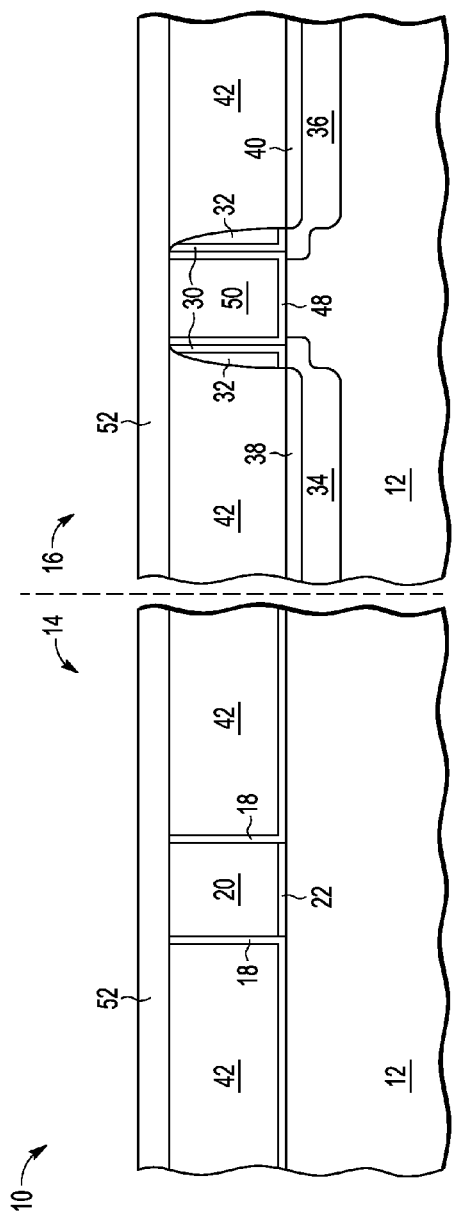
FIG. 5 is a cross section of the semiconductor device of FIG. 4 at a subsequent stage in processing.

Shown in FIG. 5 is semiconductor device 10 after forming a hard mask layer 52 in regions 14 and 16, over ILD 42 and over gate 20 and gate stack 50. In one embodiment, hard mask layer 52 may be nitride. The hard mask layer also functions as an etch-stop layer.

Figure 6:
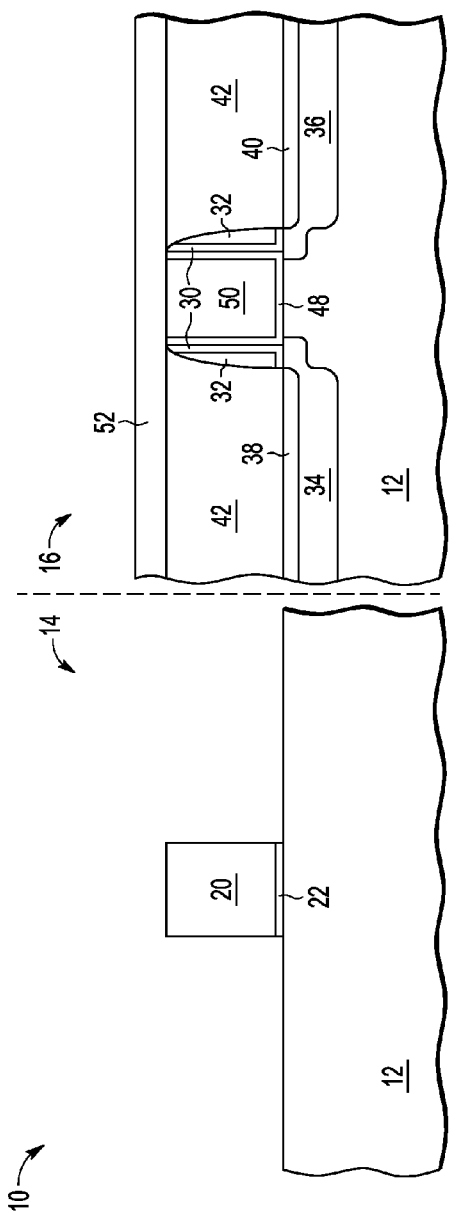
FIG. 6 is a cross section of the semiconductor device of FIG. 5 at a subsequent stage in processing.

Shown in FIG. 6 is semiconductor device 10 after patterning ILD 42 and hard mask layer 52 to remove ILD 42 and hard mask layer 52 from NVM region 14. Note that ILD 42 and hard mask layer 52 remain in logic region 16.

Shown in FIG. 7 is semiconductor device 10 after depositing a charge storage layer 54 that is for use as a charge storage layer of the NVM cell being formed in NVM region 14. Charge storage layer 54 is formed over gate 20 and substrate 12 in NVM region 14 and over hard mask layer 52 in logic region 16. A gate stack layer 56 is deposited over charge storage layer 54. For example, gate stack layer 56 may be a stack of conductive layers including one or more metal layers or a single metal layer or a polysilicon layer. Gate stack layer 56 is for use as a control gate of the NVM cell being formed in NVM region 14 and may also be referred to as a control gate layer. Charge storage layer 54 is preferably formed of metal nanocrystals that are formed on a first high-k dielectric layer. A second high-k dielectric layer is formed over and between the metal nanocrystals. Note that the first high-k dielectric layer may be referred to as a base or tunneling dielectric layer, and the second high-k dielectric layer as a fill or blocking dielectric layer which is formed around and over the metal nanocrystals. This is feasible because there is no exceptionally high heating step required before, during, or after formation of charge storage layer 54. In an alternative embodiment, charge storage layer 54 may be formed with silicon nanocrystals.

Shown in FIG. 8 is semiconductor device 10 after patterning gate stack layer 56 to remove gate stack layer 56 from logic region 16 and to form a control gate in NVM region 14. Therefore, control gate 56 overlaps a sidewall of select gate 20. Note that, in an alternate embodiment, patterning gate stack layer 56 may include performing an anisotropic etch of gate stack layer 56 to result in a remaining portion of gate stack layer 56 (i.e. control gate 56) adjacent select gate 20. In this embodiment, a portion of charge storage layer 54 would still be located between select gate 20 and control gate 56; however, control gate 56 would not overlap a sidewall of select gate 20. After patterning gate stack layer 56 in NVM region 14, charge storage layer 54 is etched to leave a remaining portion of charge storage layer 54 aligned to control gate 56.

Figure 9:
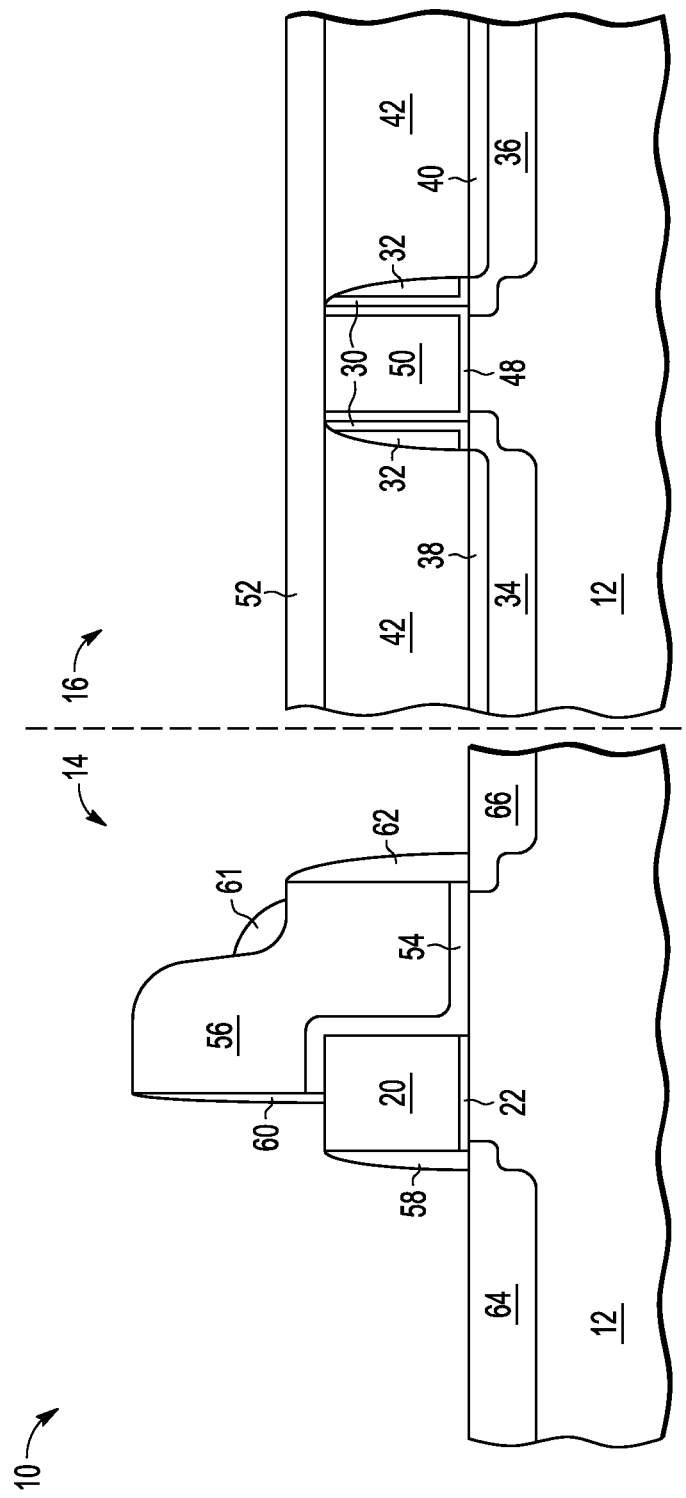
FIG. 9 is a cross section of the semiconductor device of FIG. 8 at a subsequent stage in processing.

Shown in FIG. 9 is semiconductor device 10 after formation of source/drain regions 64 and 66 and sidewall spacers 58, 60, 61, and 62 adjacent an exposed sidewall of select gate 20 and adjacent sidewalls of control gate 56. The sidewall spacers may additionally include a liner layer between the spacers and the select and control gates. In one embodiment, shallow implants are performed to first form extension regions in substrate 12 which laterally extend from each of the exposed sidewall of select gate 20 and the sidewall of control gate 56 that is over substrate 12 and laterally spaced apart from select gate 20. After formation of the extension regions, sidewalls spacers 58, 60, 61, and 62 may be formed. This may be achieved by conformally depositing a liner layer and nitride and performing an anisotropic etch. After formation of the sidewall spacers, deep implants may be performed to form source/drain regions 64 and 66 in substrate 12 which laterally extend from each of the exposed sidewall of select gate 20 and the sidewall of control gate 56 that is laterally spaced apart from select gate 20. Therefore, note that source/drain regions 64 and 66 may include the previously formed extension regions.

Figure 10:
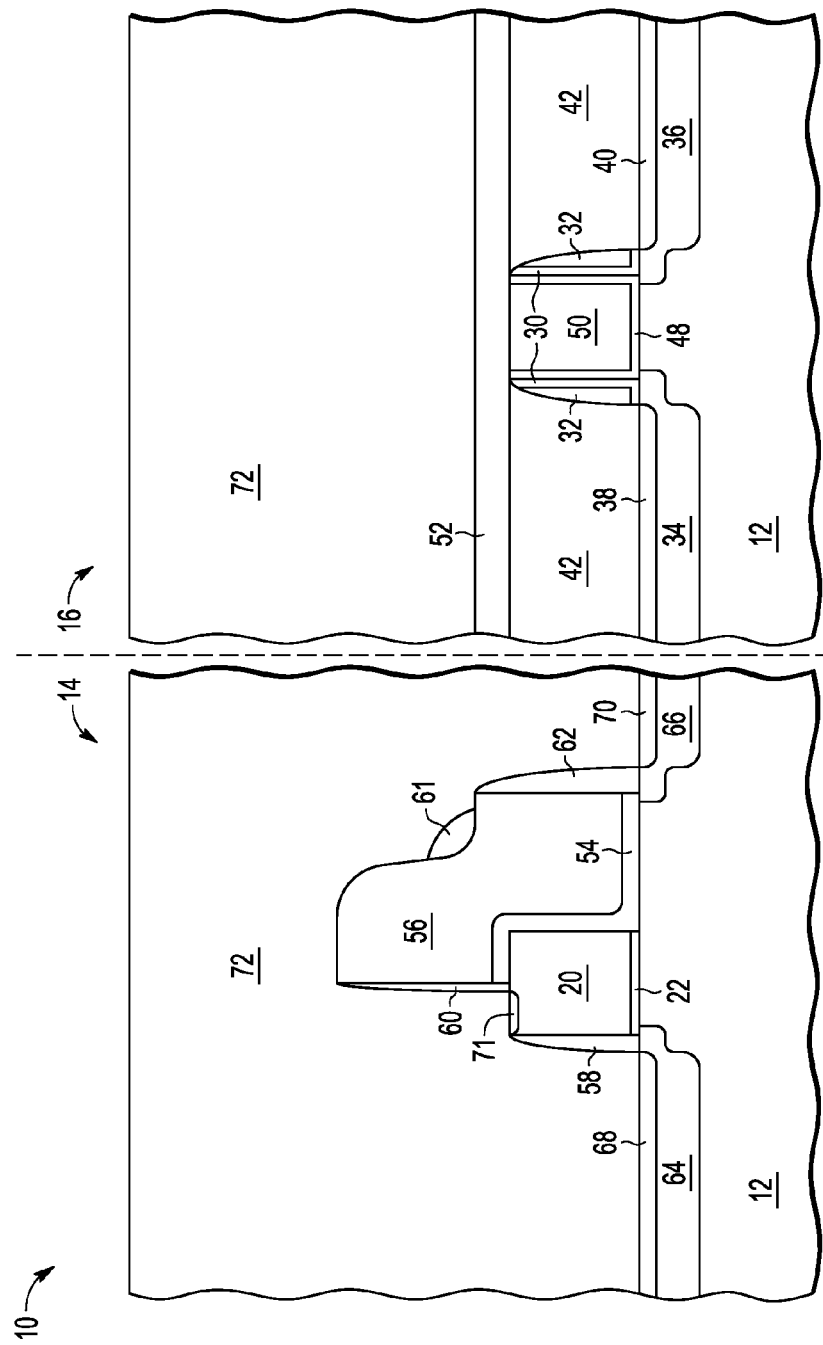
FIG. 10 is a cross section of the semiconductor device of FIG. 9 at a subsequent stage in processing.

Shown in FIG. 10 is semiconductor device 10 after formation of silicide regions 68 and 70 on source/drain regions 64 and 66, respectively, and silicide region 71 on exposed portions of select gate 20 in NVM region 14 and formation and subsequent planarization of an ILD 72 in NVM region 14 and logic region 16. During silicidation to form silicide regions 68, 70, and 71, hard mask layer 52 protects logic region 16. ILD 72 is then formed over the NVM cells in NVM region 14 (e.g. over select gate 20 and control gate 56) and over hard mask layer 52 in logic region 16.

Note that in the illustrated embodiment, source/drain regions 64 and 66 are not formed at the same processing stage as source/drain regions 34 and 36, prior to deposition of ILD 42. Instead, they are formed later in processing. That is, they are formed after formation of the actual (i.e. replacement) gate dielectric and gate stack of logic region 16 and after removal of ILD 42. The second ILD, ILD 72, is then formed over substrate 12, source/drain regions 64 and 66, and select gate 20 and control gate 56.

Thus is shown an efficient manufacturing process for forming NVM cells and logic transistors that allows for high performance materials in the logic transistors while maintaining use of a thermally grown oxygen-containing dielectric and polysilicon gate in the NVM cells. The high-k materials of the logic transistors need not face exceptionally high temperatures that would threaten their integrity.

Although the invention is described herein with reference to specific embodiments, various modifications and changes can be made without departing from the scope of the present invention as set forth in the claims below. For example, different gate stacks may be formed using the replacement gate process for different types of devices which may be integrated with NVM split gate devices. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.'

Item 1 includes a method of forming an NVM cell and a logic transistor using a semiconductor substrate, the method includes: in a non-volatile memory (NVM) region, forming over the semiconductor substrate a first thermally-grown oxygen-containing layer, a select gate of a first material, and a first dielectric layer, wherein the select gate is on the first thermally-grown oxygen-containing layer, a top surface of the first dielectric layer is substantially aligned with a top surface of the select gate, and the first dielectric layer has a first opening in which the select gate is present in the first opening; in a logic region, forming over the semiconductor substrate a second thermally-grown oxygen-containing layer and a dummy gate of the first material and, after forming the first thermally-grown oxygen-containing layer and the select gate, forming a source and a drain in the semiconductor substrate, and a second dielectric layer, wherein the dummy gate is on the second thermally-grown oxygen-containing layer, a top surface of the second dielectric layer is substantially aligned with a top surface of the dummy gate, and the second dielectric layer has a second opening in which the dummy gate is present in the second opening; replacing the second thermally-grown oxygen-containing layer with a high-k gate dielectric and the dummy gate with a metal gate; removing the first dielectric layer in the NVM region while leaving the second dielectric layer in the logic region; forming a charge storage layer over the NVM region including over the select gate; forming a conductive layer over the charge storage layer; etching the conductive layer to form a control gate; and etching the charge storage layer to leave a remaining portion of the charge storage layer aligned to the control gate. Item 2 includes the method of item 1, wherein: the forming the charge storage layer is further characterized by forming nanocrystals over the second dielectric layer and the metal gate; and the etching the charge storage layer is further characterized by removing the charge storage layer over the second dielectric layer and the metal gate. Item 3 includes the method of item 2, wherein: the step of forming the conductive layer is further characterized by forming the conductive layer over the logic region; and the step of etching the conductive layer is further characterized by removing the conductive layer over the logic region. Item 4 includes the method of item 1, wherein the forming the first dielectric layer and forming the second dielectric layer are further characterized as forming the first dielectric and the second dielectric layers simultaneously of a same material. Item 5 includes the method of item 1, and further includes forming a first silicide region on the source and a second silicide region on the drain of the logic transistor prior to the forming of the second dielectric layer. Item 6 includes the method of item 5, and further includes forming a sidewall spacer around the metal gate prior to the forming the second dielectric layer. Item 7 includes the method of item 6, and further includes forming a liner around the metal gate prior to the forming the sidewall spacer. Item 8 includes the method of item 7, and further includes forming a hard mask over the NVM region and the logic region prior to the removing the first dielectric layer. Item 9 includes the method of item 8, and further includes removing the hard mask from over the NVM region while leaving the hard mask over the logic region prior to removing the first dielectric layer. Item 10 includes the method of item 1, wherein the first material comprises polysilicon. Item 11 includes the method of item 1, wherein: the forming the metal gate comprises forming a stack comprising a work-function-setting metal on the high-k gate dielectric and a top metal over the work-function-setting metal. Item 12 includes the method of item 1, wherein the forming the charge storage layer comprises: forming a base dielectric layer; forming nanocrystals on the base dielectric layer; and forming a fill dielectric layer around and over the nanocrystals. Item 13 includes the method of item 1, wherein the forming the charge storage layer comprises forming a layer of silicon nitride.

Item 14 includes a method of forming a non-volatile memory (NVM) cell and a logic transistor using a semiconductor substrate, the method including: forming a polysilicon select gate over a first thermally-grown oxygen-containing layer and a dummy gate over a second thermally-grown oxygen-containing layer; after forming the first and second thermally-grown oxygen-containing layers, forming a sidewall spacer around the dummy gate; forming source/drains in the substrate adjacent to the dummy gate; forming a dielectric layer around the polysilicon select gate and the dummy gate wherein a top surface of the dielectric layer is substantially aligned with a top surface of the polysilicon select gate and a top surface of the dummy gate; removing the dummy gate; replacing the second thermally-grown oxygen-containing layer with a high-k dielectric; replacing the dummy gate with a metal gate; forming a hard mask over the metal gate; removing the dielectric layer from around the polysilicon select gate while leaving the dielectric layer around the metal gate; forming a charge storage layer over the semiconductor substrate; forming a conductive layer over the charge storage layer; etching the conductive layer to form a control gate over a portion of the charge storage layer and removing the conductive layer from over the hard mask; etching the charge storage layer to leave a portion of the charge storage layer under the control gate and removing the charge storage layer from over the hard mask; and forming second source/drains in the substrate adjacent to the select gate and control gate. Item 15 includes the method of item 14, and further includes removing the hard mask. Item 16 includes the method of item 15, and further includes siliciding the second source/drains prior to the removing the hard mask. Item 17 includes the method of item 16, and further includes siliciding the first source/drains prior to the forming the dielectric layer. Item 18 includes the method of item 14, wherein the replacing the dummy gate further comprises forming a work-function-setting layer on the high-k dielectric and forming a metal fill over the work-function-setting layer.

Item 19 includes a method, including: forming a polysilicon select gate of a non-volatile memory (NVM) cell on a first thermally-grown oxygen-containing layer in an NVM region of a semiconductor substrate and a polysilicon dummy gate on a second thermally-grown oxygen-containing layer in a logic region of the semiconductor substrate; forming source/drains adjacent the polysilicon dummy gate; forming a sidewall spacer around the polysilicon dummy gate and siliciding the source/drains adjacent the sidewall spacer; forming a dielectric having a top surface that is substantially aligned to a top surface of the polysilicon select gate and a top surface of the polysilicon dummy gate; replacing the polysilicon dummy gate and the second thermally-grown oxygen-containing layer with a metal gate and a high-k dielectric layer, respectively; removing the dielectric from around the polysilicon select gate; forming a charge storage layer over the logic region and the NVM region; forming a conductive layer over the logic region and the NVM region; etching the conductive layer over the NVM region to form a control gate over the charge storage layer and removing the conductive layer from the logic region; etching the charge storage layer to leave the charge storage layer under and aligned with the control gate and to remove the charge storage layer over the logic region; and forming source/drain regions in the substrate in the NVM region adjacent to the control gate and to the polysilicon select gate. Item 20 includes the method of item 19, and further includes: forming a hard mask over the logic region prior to the removing the dielectric from around the polysilicon select gate; siliciding the source/drain regions in the substrate in the NVM region; and removing the hard mask after the siliciding the source/drain regions in the substrate in the NVM region.

What is claimed is:

1. A method of forming an NVM cell and a logic transistor using a semiconductor substrate, comprising:
in a non-volatile memory (NVM) region, forming over the semiconductor substrate a first thermally-grown oxygen-containing layer, a select gate of a first material, and a first dielectric layer, wherein the select gate is on the first thermally-grown oxygen-containing layer, a top surface of the first dielectric layer is substantially aligned with a top surface of the select gate, and the first dielectric layer has a first opening in which the select gate is present in the first opening;
in a logic region, forming over the semiconductor substrate a second thermally-grown oxygen-containing layer and a dummy gate of the first material and, after forming the first thermally-grown oxygen-containing layer and the select gate, forming a source and a drain in the semiconductor substrate, and a second dielectric layer, wherein the dummy gate is on the second thermally-grown oxygen-containing layer, a top surface of the second dielectric layer is substantially aligned with a top surface of the dummy gate, and the second dielectric layer has a second opening in which the dummy gate is present in the second opening;
replacing the second thermally-grown oxygen-containing layer with a high-k gate dielectric and the dummy gate with a metal gate;
forming a hard mask over the NVM region and the logic region;
removing the first dielectric layer in the NVM region while leaving the second dielectric layer in the logic region, wherein the forming the hard mask is performed prior to the removing the first dielectric layer;
forming a charge storage layer over the NVM region including over the select gate;
forming a conductive layer over the charge storage layer;
etching the conductive layer to form a control gate; and
etching the charge storage layer to leave a remaining portion of the charge storage layer aligned to the control gate.

2. The method of claim 1, wherein:
the forming the charge storage layer is further characterized by forming nanocrystals over the second dielectric layer and the metal gate; and
the etching the charge storage layer is further characterized by removing the charge storage layer over the second dielectric layer and the metal gate.

3. The method of claim 2, wherein:
the step of forming the conductive layer is further characterized by forming the conductive layer over the logic region; and
the step of etching the conductive layer is further characterized by removing the conductive layer over the logic region.

4. The method of claim 1, wherein the forming the first dielectric layer and forming the second dielectric layer are further characterized as forming the first dielectric and the second dielectric layers simultaneously of a same material.

5. The method of claim 1, further comprising forming a first silicide region on the source and a second silicide region on the drain of the logic transistor prior to the forming of the second dielectric layer.

6. The method of claim 5, further comprising:
forming a sidewall spacer around the metal gate prior to the forming the second dielectric layer.

7. The method of claim 6, further comprising:
forming a liner around the metal gate prior to the forming the sidewall spacer.

8. The method of claim 1, further comprising removing the hard mask from over the NVM region while leaving the hard mask over the logic region prior to removing the first dielectric layer.

9. The method of claim 1, wherein the first material comprises polysilicon.

10. The method of claim 1, wherein:
the forming the metal gate comprises forming a stack comprising a work-function-setting metal on the high-k gate dielectric and a top metal over the work-function-setting metal.

11. The method of claim 1, wherein the forming the charge storage layer comprises:
forming a base dielectric layer;
forming nanocrystals on the base dielectric layer; and
forming a fill dielectric layer around and over the nanocrystals.

12. The method of claim 1, wherein the forming the charge storage layer comprises forming a layer of silicon nitride.

13. A method of forming a non-volatile memory (NVM) cell and a logic transistor using a semiconductor substrate, comprising:
forming a polysilicon select gate over a first thermally-grown oxygen-containing layer and a dummy gate over a second thermally-grown oxygen-containing layer;
after forming the first and second thermally-grown oxygen-containing layers, forming a sidewall spacer around the dummy gate;
forming source/drains in the substrate adjacent to the dummy gate;
forming a dielectric layer around the polysilicon select gate and the dummy gate wherein a top surface of the dielectric layer is substantially aligned with a top surface of the polysilicon select gate and a top surface of the dummy gate;
removing the dummy gate;
replacing the second thermally-grown oxygen-containing layer with a high-k dielectric;
replacing the dummy gate with a metal gate;
forming a hard mask over the metal gate;
removing the dielectric layer from around the polysilicon select gate while leaving the dielectric layer around the metal gate, wherein the forming the hard mask is performed prior to the removing the dielectric layer;
forming a charge storage layer over the semiconductor substrate;
forming a conductive layer over the charge storage layer;
etching the conductive layer to form a control gate over a portion of the charge storage layer and removing the conductive layer from over the hard mask;
etching the charge storage layer to leave a portion of the charge storage layer under the control gate and removing the charge storage layer from over the hard mask; and
forming second source/drains in the substrate adjacent to the select gate and control gate.

14. The method of claim 13, further comprising removing the hard mask.

15. The method of claim 14 further comprising siliciding the second source/drains prior to the removing the hard mask.

16. The method of claim 15 further comprising siliciding the first source/drains prior to the forming the dielectric layer.

17. The method of claim 13, wherein the replacing the dummy gate further comprises forming a work-function-setting layer on the high-k dielectric and forming a metal fill over the work-function-setting layer.

18. A method, comprising:
- forming a polysilicon select gate of a non-volatile memory (NVM) cell on a first thermally-grown oxygen-containing layer in an NVM region of a semiconductor substrate and a polysilicon dummy gate on a second thermally-grown oxygen-containing layer in a logic region of the semiconductor substrate;
- forming source/drains adjacent the polysilicon dummy gate;
- forming a sidewall spacer around the polysilicon dummy gate and siliciding the source/drains adjacent the sidewall spacer;
- forming a dielectric having a top surface that is substantially aligned to a top surface of the polysilicon select gate and a top surface of the polysilicon dummy gate;
- replacing the polysilicon dummy gate and the second thermally-grown oxygen-containing layer with a metal gate and a high-k dielectric layer, respectively;
- forming a hard mask over the logic region;
- removing the dielectric from around the polysilicon select gate, wherein the forming the hard mask is performed prior to the removing the dielectric from around the polysilicon select gate;
- forming a charge storage layer over the logic region and the NVM region;
- forming a conductive layer over the logic region and the NVM region;
- etching the conductive layer over the NVM region to form a control gate over the charge storage layer and removing the conductive layer from the logic region;
- etching the charge storage layer to leave the charge storage layer under and aligned with the control gate and to remove the charge storage layer over the logic region; and
- forming source/drain regions in the substrate in the NVM region adjacent to the control gate and to the polysilicon select gate.

19. The method of claim 18 further comprising:
- siliciding the source/drain regions in the substrate in the NVM region; and
- removing the hard mask after the siliciding the source/drain regions in the substrate in the NVM region.

\* \* \* \* \*

UNITED STATES PATENT AND TRADEMARK OFFICE
CERTIFICATE OF CORRECTION

PATENT NO. : 8,669,158 B2  
APPLICATION NO. : 13/780574  
DATED : March 11, 2014  
INVENTOR(S) : Mark D. Hall et al.

Page 1 of 1

It is certified that error appears in the above-identified patent and that said Letters Patent is hereby corrected as shown below:

Title page, Item [73], add the Assignee --Freescale Semiconductor, Inc., Austin, TX--

Signed and Sealed this
Eighteenth Day of November, 2014

Michelle K. Lee
*Deputy Director of the United States Patent and Trademark Office*